(12) United States Patent
Tian et al.

(10) Patent No.: US 9,548,298 B1
(45) Date of Patent: Jan. 17, 2017

(54) METHOD OF IMPROVING BIPOLAR DEVICE SIGNAL TO NOISE PERFORMANCE BY REDUCING THE EFFECT OF OXIDE INTERFACE TRAPPING CENTERS

(71) Applicant: Texas Instruments Incorporated, Dallas, TX (US)

(72) Inventors: Weidong Tian, Dallas, TX (US); YuGuo Wang, Plano, TX (US); Tathagata Chatterjee, Allen, TX (US); Rajni J. Aggarwal, Garland, TX (US)

(73) Assignee: TEXAS INSTUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/942,979

(22) Filed: Nov. 16, 2015

(51) Int. Cl.
*H01L 21/338* (2006.01)
*H01L 27/06* (2006.01)
*H01L 29/732* (2006.01)
*H01L 21/8238* (2006.01)
*H01L 21/8222* (2006.01)

(52) U.S. Cl.
CPC ....... *H01L 27/0623* (2013.01); *H01L 21/8222* (2013.01); *H01L 21/823892* (2013.01); *H01L 29/732* (2013.01)

(58) Field of Classification Search
CPC .......................... H01L 21/8222; H01L 29/732
See application file for complete search history.

(56) References Cited

U.S. PATENT DOCUMENTS

2008/0203490 A1* 8/2008 Feilchenfeld ....... H01L 21/8249
257/370

* cited by examiner

*Primary Examiner* — Elias M Ullah
(74) *Attorney, Agent, or Firm* — Jacqueline J. Garner; Charles A. Brill; Frank D. Cimino

(57) ABSTRACT

An integrated circuit includes an NMOS transistor, a PMOS transistor and a vertical bipolar transistor. The vertical bipolar transistor has an intrinsic base with a band barrier at least 25 meV high at a surface boundary of the intrinsic base, except at an emitter-base junction with an emitter, and except at a base-collector junction with a collector. The intrinsic base may be laterally surrounded by an extrinsic base with a higher dopant density than the intrinsic base, wherein a higher dopant density provides the band barrier at lateral surfaces of the intrinsic base. A gate may be disposed on a gate dielectric layer over a top surface boundary of the intrinsic base adjacent to the emitter. The gate is configured to accumulate the intrinsic base immediately under the gate dielectric layer, providing the band barrier at the top surface boundary of the intrinsic base.

8 Claims, 17 Drawing Sheets

METHOD OF IMPROVING BIPOLAR DEVICE SIGNAL TO NOISE PERFORMANCE BY REDUCING THE EFFECT OF OXIDE INTERFACE TRAPPING CENTERS

FIELD OF THE INVENTION

This invention relates to the field of integrated circuits. More particularly, this invention relates to bipolar transistors in integrated circuits.

BACKGROUND OF THE INVENTION

Some integrated circuits contain vertical bipolar transistors, along with n-channel metal oxide semiconductor (NMOS) transistors and p-channel metal oxide semiconductor (PMOS) transistors. The vertical bipolar transistors used in circuits such as bandgap reference circuits, require high gain, for example greater than 5, and low noise, for example a signal-to-noise ratio greater than 70 decibels (dB), at collector currents of 100 picoamperes (pA) to 100 microamperes (pA). Vertical bipolar transistors in such integrated circuits are particularly susceptible to burst noise, also referred to as random telegraph signal (RTS) noise and popcorn noise. Moreover, it is desirable for the vertical bipolar transistors to occupy as little space as possible to reduce the cost of the integrated circuit. Simultaneously attaining desired levels of gain, noise and size has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit includes an NMOS transistor, a PMOS transistor and a vertical bipolar transistor. The vertical bipolar transistor has an intrinsic base with a band barrier at least 25 milli-electron volts (meV) high at a surface boundary of the intrinsic base, except at an emitter-base junction with an emitter, and except at a base-collector junction with a collector of the vertical bipolar transistor. In one version of the integrated circuit, the intrinsic base may be laterally surrounded by an extrinsic base with a higher dopant density than the intrinsic base, wherein a higher dopant density provides the band barrier at lateral surfaces of the intrinsic base. A gate may be disposed on a gate dielectric layer over a top surface boundary of the intrinsic base adjacent to the emitter. The gate is configured to accumulate the intrinsic base immediately under the gate dielectric layer, providing the band barrier at the top surface boundary of the intrinsic base.

DETAILED DESCRIPTION OF EXAMPLE EMBODIMENTS

Figure 1:
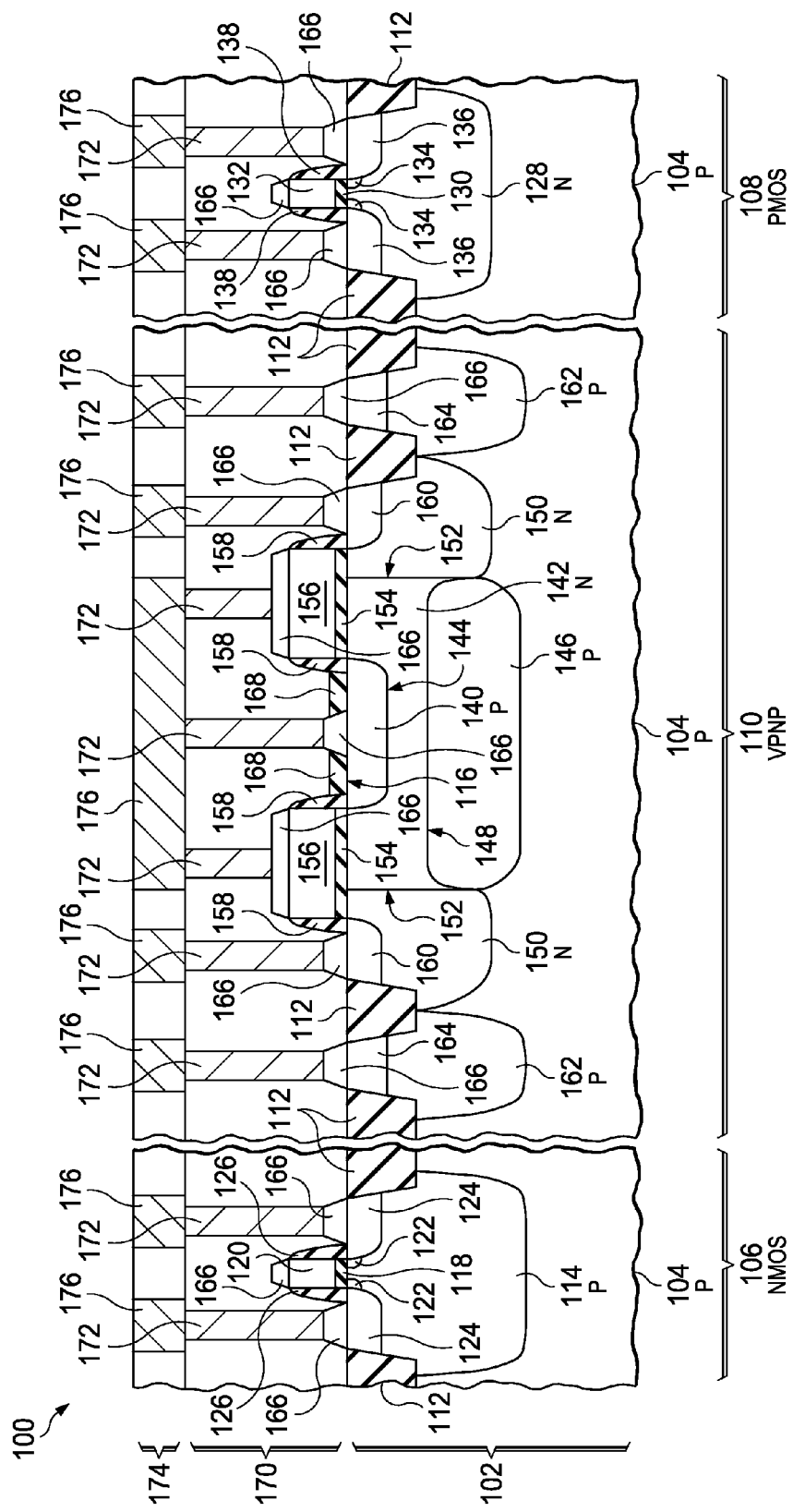
FIG. 1 is a cross section of an example integrated circuit containing an NMOS transistor, a PMOS transistor and a vertical bipolar transistor.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit includes an NMOS transistor, a PMOS transistor and a vertical bipolar transistor. The vertical bipolar transistor may be a PNP bipolar transistor or an NPN bipolar transistor. The vertical bipolar transistor has an intrinsic base with a band barrier at least 25 meV high at a surface boundary of the intrinsic base, except at an emitter-base junction with an emitter, and except at a base-collector junction with a collector of the vertical bipolar transistor. Work done in pursuit of the examples disclosed herein has discovered the band barrier advantageously reduces recombination of carriers in the base of the vertical bipolar transistor, and thus provides both a higher gain and a higher signal-to-noise ratio.

In one version of the integrated circuit, the intrinsic base may be laterally surrounded by an extrinsic base with a higher dopant density than the intrinsic base, wherein a higher dopant density provides the band barrier at lateral surfaces of the intrinsic base. The intrinsic base and extrinsic base may be formed by compensating the extrinsic base with dopants of an opposite conductivity type in the region for the intrinsic base. A gate may be disposed on a gate dielectric layer over a top surface boundary of the intrinsic base adjacent to the emitter. The gate is configured to accumulate the intrinsic base immediately under the gate dielectric layer, providing the band barrier at the top surface boundary of the intrinsic base.

Examples disclosed herein will describe PNP vertical bipolar transistors. It will be recognized that NPN vertical bipolar transistors having similar features and advantages may be formed by, mutatis mutandis, appropriate changes in dopant polarity, dopants, and implant parameters.

It is common for a region of semiconductor material in an integrated circuit to have both p-type dopants and n-type dopants. For the purposes of this disclosure, the term net average dopant density of a region is understood to mean a difference between a density of the p-type dopants and a density of the n-type dopants, averaged over the region. If the density of the p-type dopants is higher than the density of the n-type dopants, the region is p-type. Conversely, if the density of the n-type dopants is higher than the density of the p-type dopants, the region is n-type.

FIG. 1 is a cross section of an example integrated circuit containing an NMOS transistor, a PMOS transistor and a vertical bipolar transistor. The integrated circuit 100 is formed in and on a substrate 102 comprising a p-type silicon-based semiconductor material 104. The substrate 102 may be, for example, a silicon wafer or a silicon-on-insulator (SOI) wafer. The semiconductor material 104 may be, for example, a top portion of a bulk silicon wafer, an epitaxial layer on a silicon wafer, or possibly a silicon device layer of an SOI wafer. The integrated circuit 100 includes the NMOS transistor 106, the PMOS transistor 108 and the vertical PNP bipolar transistor 110. Field oxide 112 is disposed in the substrate 102 to laterally isolate components of the integrated circuit 100 and separate regions of different polarity, such as n-type diffused regions and p-type diffused regions, and n-type wells and p-type wells.

The NMOS transistor 106 is disposed in and on a first p-type well 114, which is disposed in the semiconductor material 104. The first p-type well 114 may be doped primarily with boron, with an average dopant density of $5 \times 10^{17}$ cm$^{-3}$ to $1.2 \times 10^{18}$ cm$^{-3}$. The first p-type well 114 may extend to a depth of 500 nanometers to 1 micron below a top surface 116 of the substrate 102. The NMOS transistor 106 includes a gate dielectric layer 118 at the top surface 116, and a gate 120 over the gate dielectric layer 118. The NMOS transistor 106 further includes n-type drain extensions 122 in the substrate 102 extending partway under the gate 120, and n-type deep source/drain regions 124 in the substrate 102 adjacent to the gate 120. Gate sidewall spacers 126 may be disposed adjacent to lateral surfaces of the gate 120.

The PMOS transistor 108 is disposed in and on a first n-type well 128, which is disposed in the semiconductor material 104. The first n-type well 128 may be doped primarily with phosphorus, with an average dopant density of $4 \times 10^{17}$ cm$^{-3}$ to $1 \times 10^{18}$ cm$^{-3}$. The first n-type well 128 may extend to a depth of 400 nanometers to 900 nanometers below the top surface 116 of the substrate 102. The PMOS transistor 108 includes a gate dielectric layer 130 at the top surface 116, and a gate 132 over the gate dielectric layer 130. The PMOS transistor 108 further includes p-type drain extensions 134 in the substrate 102 extending partway under the gate 132, and p-type deep source/drain regions 136 in the substrate 102 adjacent to the gate 132. Gate sidewall spacers 138 may be disposed adjacent to lateral surfaces of the gate 132.

The vertical PNP bipolar transistor 110 has a p-type emitter 140 disposed in the substrate 102, extending from the top surface 116 to a depth of 100 nanometers to 400 nanometers in the substrate 102. The emitter 140 may be doped primarily with boron, with an average net dopant density greater than $1 \times 10^{19}$ cm$^{-3}$, which advantageously reduces a series resistance of the vertical PNP bipolar transistor 110. The vertical PNP bipolar transistor 110 further has an n-type intrinsic base 142 contacting the emitter 140 at an emitter-base junction 144. The intrinsic base 142 is disposed in the substrate 102 below, and laterally surrounding, the emitter 140, contacting the emitter 140. The intrinsic base 142 extends to the top surface 116 of the substrate 102 adjacent to the emitter 140. The vertical PNP bipolar transistor 110 then has a p-type collector 146 disposed in the substrate 102 immediately below the intrinsic base 142, contacting the intrinsic base 142 at a base-collector junction 148. The intrinsic base 142 may be 200 nanometers to 400 nanometers thick between the emitter-base junction 144 and the base-collector junction 148. An average net dopant density in the intrinsic base 142 may be $1 \times 10^{17}$ cm$^{-3}$ to $5 \times 10^{17}$ cm$^{-3}$, which, in combination with being 200 nanometers to 400 nanometers thick, advantageously enables a desired gain above 5. The collector 146 may extend 200 nanometers to 400 nanometers below the intrinsic base 142 and may have an average net dopant density of $1 \times 10^{17}$ cm$^{-3}$ to $5 \times 10^{17}$ cm$^{-3}$.

The vertical PNP bipolar transistor 110 is configured to have a band barrier at least 25 meV high at a surface boundary of the intrinsic base 142, except at the emitter-base junction 144, and except at the base-collector junction 148. The vertical PNP bipolar transistor 110 includes an n-type extrinsic base 150 laterally surrounding the intrinsic base 142. The extrinsic base 150 has a net average dopant density at least 3 times the net average dopant density of the intrinsic base 142, so that the band barrier at a lateral surface boundary 152 of the intrinsic base 142 is provided by band bending resulting from the higher net doping in the extrinsic base 150. The extrinsic base 150 and the first n-type well 128 containing the PMOS transistor 108 may have similar distributions of n-type dopants as a result of optionally being formed concurrently.

A gate dielectric layer 154 is disposed at the top surface 116 of the substrate 102 over the intrinsic base 142, extending from the emitter 140 to partially overlapping the extrinsic base 150, around the emitter 140. A gate 156 is disposed over the gate dielectric layer 154. The gate 156 is electrically connected to the emitter 140 or a positive bias supply node of the integrated circuit 100, so that during operation of the integrated circuit 100 the intrinsic base 142 immediately below the gate 156 is biased into accumulation, so as to form an accumulation layer immediately below the gate 156. The accumulation layer provides the band barrier where the intrinsic base 142 abuts the top surface 116 of the substrate 102. In versions of the instant example wherein the gate 156 is coupled to the emitter 140 or a positive bias supply node such as an analog Vcc node, the band barrier is significantly higher than 25 meV under the gate 156 which advantageously further reduces recombination at the gate dielectric layer 154. The intrinsic base 142 extends at least 500 nanometers under the gate 156 to advantageously reduce recombination of base current in the emitter 140. A version of the vertical PNP bipolar transistor 110 having the combination of the extrinsic base 150 surrounding the intrinsic base 142 and the gate 156 disposed over the gate dielectric layer 154 over the intrinsic base 142 as described in reference to FIG. 1 has demonstrated gain greater than 5, and a signal-to-noise ratio greater than 70 dB, at collector currents of 100 pA to 100 µA. The vertical configuration advantageously reduces a size of the vertical PNP bipolar transistor 110 compared to other configurations used to obtain a high gain and a high signal-to-noise ratio. Gate sidewall spacers 158 may be disposed adjacent to lateral surfaces of the gate 156.

The vertical PNP bipolar transistor 110 may include n-type base contact regions 160 in the extrinsic base 150 at the top surface 116 of the substrate 102. The base contact regions 160 and the deep source/drain regions 124 of the NMOS transistor 106 may have similar distributions of n-type dopants as a result of optionally being formed concurrently.

Connection to the collector 146 is made through the p-type semiconductor material 104 under and adjacent to the collector 146, then through a second p-type well 162. The second p-type well 162 may possibly surround the extrinsic base 150 as indicated in FIG. 1. The second p-type well 162 and the first p-type well 114 may have similar distributions of n-type dopants as a result of optionally being formed concurrently. The vertical PNP bipolar transistor 110 may include p-type collector contact regions 164 in the second p-type well 162 at the top surface 116 of the substrate 102. The collector contact regions 164 and the deep source/drain regions 136 of the PMOS transistor 108 may have similar distributions of p-type dopants as a result of optionally being formed concurrently.

Metal silicide 166 may be disposed on exposed semiconductor material at the top surface 116 of the substrate 102, and possibly on top surfaces of the gates 120, 130 and 156, to improve electrical connections to the NMOS transistor 106, the PMOS transistor 108 and the vertical PNP bipolar transistor 110. The metal silicide 166 may optionally be blocked from portions of the top surface 116 on the emitter 140 by silicide block dielectric 168. It was discovered in pursuit of the instant example that the silicide block dielectric 168 disposed adjacent to the gate 156 was particularly effective in further reducing recombination in the intrinsic base 142, as a larger portion of injected carriers from the metal silicide 166 on the emitter 140 flowed downward into the intrinsic base 142 rather than laterally to the extrinsic base 150. The integrated circuit 100 includes a system of interconnects to provide electrical connections to components in the substrate 102. A pre-metal dielectric (PMD) layer 170 is disposed over the substrate 102 and over the NMOS transistor 106, the PMOS transistor 108 and the vertical PNP bipolar transistor 110. The PMD layer 170 may include, for example, a PMD liner of silicon nitride, a main layer of silicon dioxide-based dielectric material such as phosphorus silicon glass (PSG) or boron phosphorus silicon glass (BPSG), and possibly a cap layer of silicon nitride, silicon carbide or silicon carbide nitride to provide a stop layer for a subsequent etchback or chemical mechanical polish (CMP) operation. Contacts 172 are disposed through the PMD layer 170 to provide electrical connections to the deep source/drain regions 124 of the NMOS transistor 106, to the deep source/drain regions 136 of the PMOS transistor 108, to the base contact regions 160 in the extrinsic base 150, to the collector contact regions 164 in the second p-type well 162 and to the gate 156 of the vertical PNP bipolar transistor 110, through the metal silicide 166 if present. An intra-metal dielectric (IMD) layer 174 is disposed over the PMD layer 170 and the contacts 172. The IMD layer 174 may include one or more layers of dielectric material, including a main layer of silicon dioxide-based dielectric material. Metal interconnects 176 are disposed in the IMD layer 174, making electrical connections to the contacts 172. In the instant example, the gate 156 of the vertical PNP bipolar transistor 110 is electrically coupled to the emitter 140 through instances of the contacts 172 and the metal interconnects 176, advantageously biasing the intrinsic base 142 immediately under the gate 156 into accumulation when the vertical PNP bipolar transistor 110 is operated. Alternatively, the gate 156 may be electrically coupled to a positive bias supply node of the integrated circuit 100 to provide the same advantage.

Figure 2A:
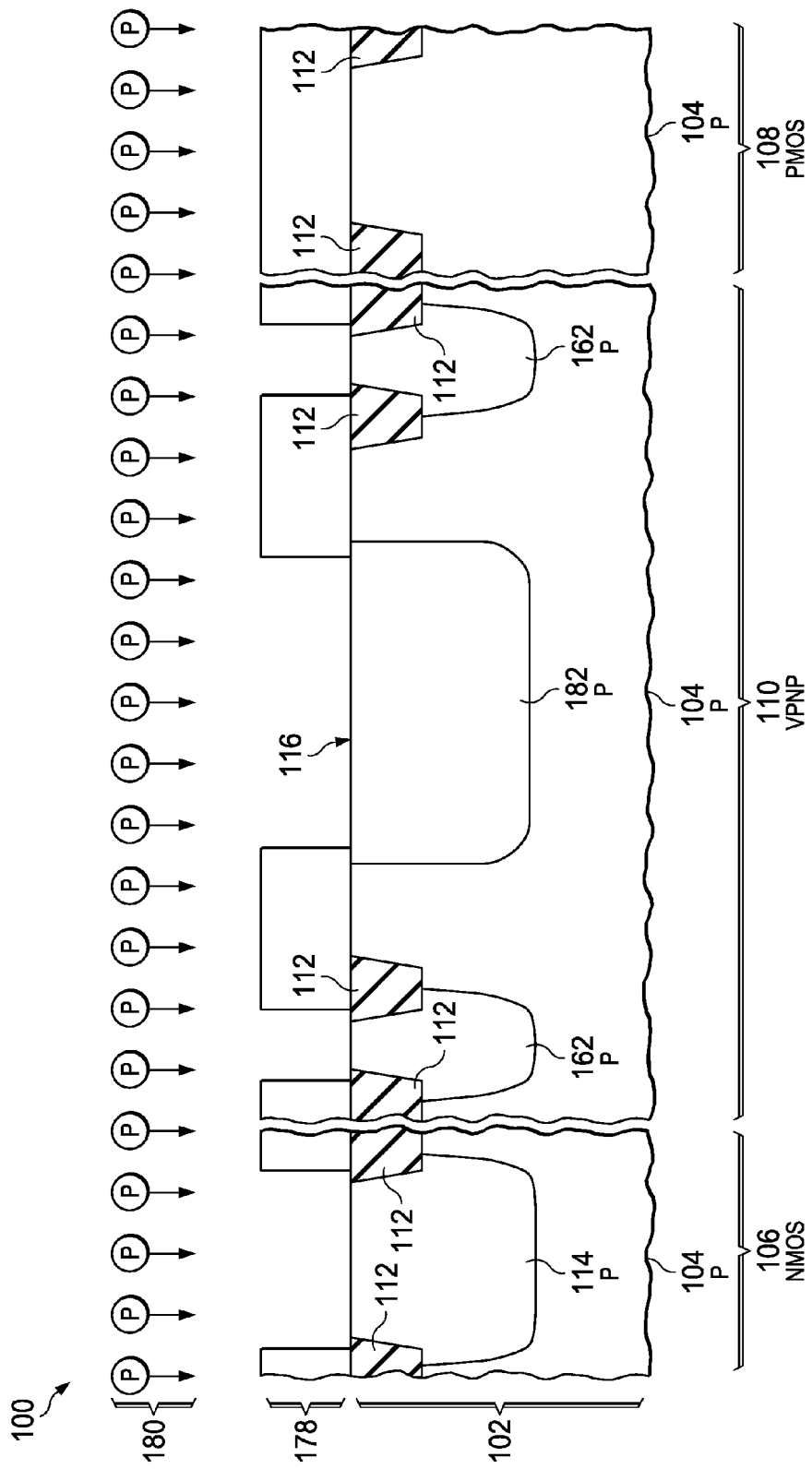
FIG. 2A through FIG. 2I are cross sections of the integrated circuit of FIG. 1, depicted in key stages of an example fabrication process.

FIG. 2A through FIG. 2I are cross sections of the integrated circuit of FIG. 1, depicted in key stages of an example fabrication process. Referring to FIG. 2A, the p-type semiconductor material 104 extends to the top surface 116 of the substrate 102. The field oxide 112 is formed in the substrate 102, for example by a shallow trench isolation (STI) process. Alternatively, the field oxide 112 may be formed by a local oxidation of silicon (LOCOS) process or other process. The field oxide 112 may extend 350 nanometers to 500 nanometers below the top surface 116 of the substrate 102. A p-type well mask 178 is formed over the substrate 102 so that areas for the first p-type well 114, the second p-type well 162 and the collector 146 of FIG. 1 are exposed. The p-type well mask 178 covers areas for the PMOS transistor 108 and the extrinsic base 150 of FIG. 1. The p-type well mask 178 may include primarily photoresist and may be formed by a photolithographic process. P-type dopants 180 are implanted into the substrate 102 in the areas exposed by the p-type well mask 178 to form the first p-type well 114, the second p-type well 162 and a collector well 182 in the area for the collector 146. The p-type dopants 180 may include primarily atomic boron, and possibly some boron difluoride ($BF_2$), and may be implanted in several doses at different energies to provide a desired distribution of dopants to enhance performance of the NMOS transistor 106. The p-type dopants 180 may be implanted at a total dose of $3 \times 10^{13}$ cm$^{-2}$ to $8 \times 10^{13}$ cm$^{-2}$, with a peak energy of 250 kilo-electron volts (keV) to 400 keV. The p-type well mask 178 is subsequently removed, for example by an ash process followed by a wet clean process. Forming the first p-type well 114, the second p-type well 162 and the collector well 182 concurrently may advantageously reduce fabrication cost and complexity of the integrated circuit 100. The substrate 102 may optionally be annealed at this point to activate the implanted p-type dopants 180 or may be annealed after further implants.

Figure 2B:
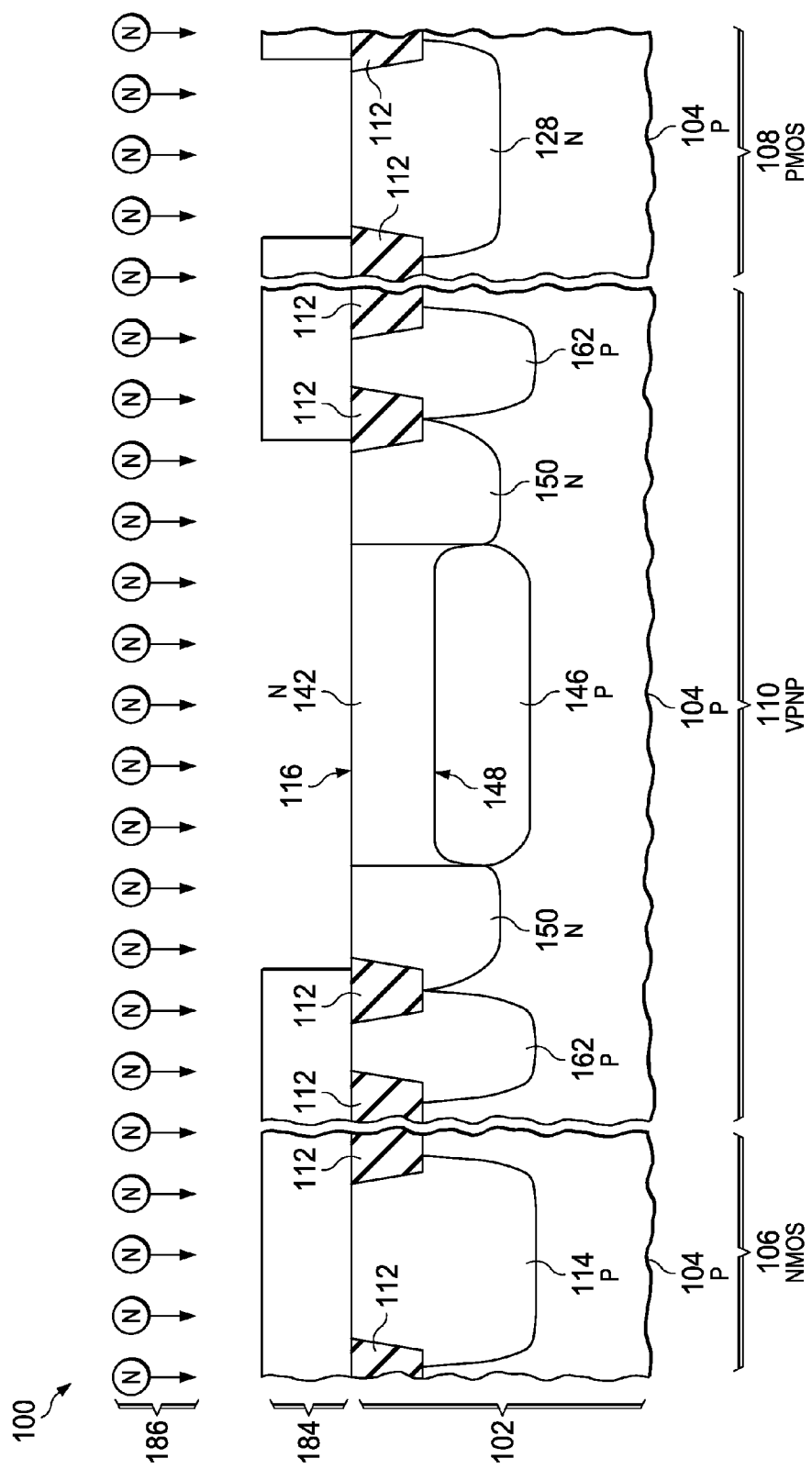

Referring to FIG. 2B, an n-type well mask 184 is formed over the substrate 102 so that areas for the first n-type well 128, the intrinsic base 142 and the extrinsic base 150 of FIG. 1 are exposed. The areas for the intrinsic base 142 and the extrinsic base 150 are contiguous. The area for the intrinsic base 142 is substantially the area for the collector well 182 of FIG. 2A. The n-type well mask 184 covers areas for the NMOS transistor 106 and the second p-type well 162 of FIG. 1. The n-type well mask 184 may be formed similarly to the p-type well mask 178 of FIG. 2A. N-type dopants 186 are implanted into the substrate 102 in the areas exposed by the n-type well mask 184 to form the first n-type well 128, the intrinsic base 142 and the extrinsic base 150. The n-type dopants 186 may include primarily phosphorus, with some arsenic, and may be implanted in several doses at different energies to provide a desired distribution of dopants to enhance performance of the PMOS transistor 108. The n-type dopants 186 may be implanted at a total dose of $2 \times 10^{13}$ cm$^{-2}$ to $7 \times 10^{13}$ cm$^{-2}$, with a peak energy of 400 kilo-electron volts (keV) to 600 keV. The intrinsic base 142 is formed by counterdoping the collector well 182 down to the base-collector junction 148. The collector 146 is consequently formed by the remaining collector well 182 below the base-collector junction 148, which is partially compensated by a tail of the n-type dopants 186. The doses and energies of the n-type dopants 186 and the p-type dopants 180 of FIG. 2A are selected to provide desired dopant densities and dopant distributions for the intrinsic well 142 and the collector 146, and to provide a desired ratio of the net average dopant density of the extrinsic base 150 to the net average dopant density of the intrinsic base 142, as explained in reference to FIG. 1. The n-type well mask 184 is subsequently removed, for example similarly to the p-type well mask 178 of FIG. 2A. Forming the first n-type well 128, the intrinsic base 142 and the extrinsic base 150 concurrently may advantageously reduce fabrication cost and complexity of the integrated circuit 100. The substrate 102 may optionally be annealed at this point to activate the implanted n-type dopants 186. In an alternative fabrication sequence, the n-type dopants 186 may be implanted prior to the p-type dopants 180.

Figure 2C:
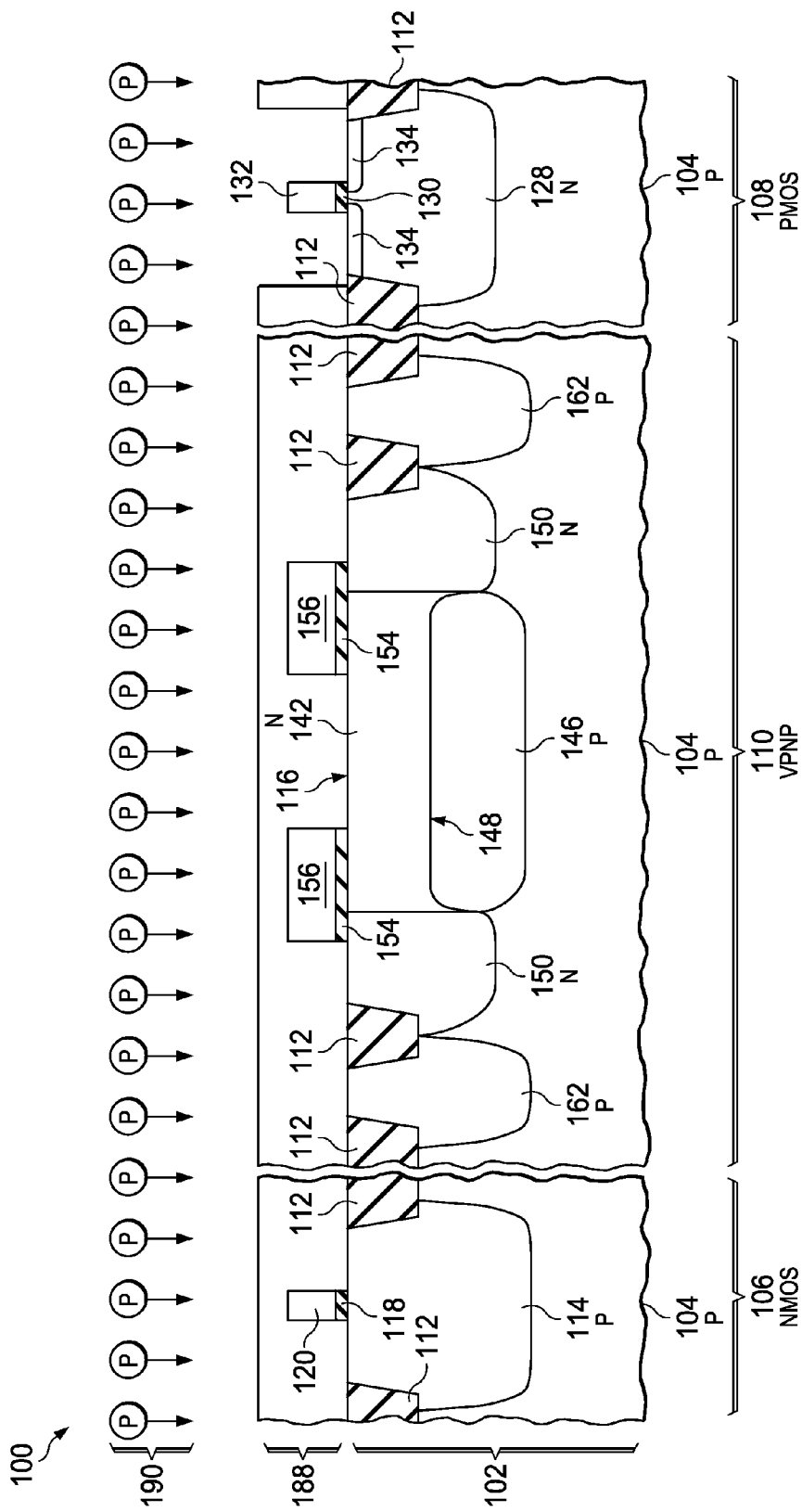

Referring to FIG. 2C, the gate dielectric layers 118, 130 and 154 of the NMOS transistor 106, the PMOS transistor 108 and the vertical PNP bipolar transistor 110, respectively, are formed at the top surface of the substrate 102. The gate dielectric layers 118, 130 and 154 may be formed concurrently, for example, by thermal oxidation of silicon in the substrate 102, advantageously reducing fabrication cost and complexity of the integrated circuit 100. The gates 120, 132 and 156 of the NMOS transistor 106, the PMOS transistor 108 and the vertical PNP bipolar transistor 110, respectively, are formed on the gate dielectric layers 118, 130 and 154. The gates 120, 132 and 156 may be formed concurrently, for example, by forming a layer of polycrystalline silicon, referred to as polysilicon, on the gate dielectric layers 118, 130 and 154 and patterning the layer of polysilicon with a gate mask and gate etch process. Forming the gates 120, 132 and 156 concurrently may advantageously further reduce fabrication cost and complexity of the integrated circuit 100. The gate dielectric layers 154 of the vertical PNP bipolar transistor 110 may be less than 5 nanometers thick, advantageously enabling accumulation of the intrinsic base 142 when a bias is applied to the gate 156 that is more than 30 millivolts above a flatband bias. Offset spacers, not shown in FIG. 2C et seq., May be formed on surfaces of the gates 120, 132 and 156 prior to subsequent implants.

A p-type drain extension mask 188 is formed over the substrate 102 so that the PMOS transistor 108 is exposed, and the NMOS transistor 106 is covered. In the instant example, the vertical PNP bipolar transistor 110 is also covered by the p-type drain extension mask 188. In an alternate version of the instant example, the p-type drain extension mask 188 may expose a portion or all of the vertical PNP bipolar transistor 110. The p-type drain extension mask 188 may include primarily photoresist and may be formed by a photolithographic process. P-type dopants 190 are implanted into the substrate 102 where exposed by the p-type drain extension mask 188, including into the substrate 102 adjacent to the gate 132 of the PMOS transistor 108 to form the p-type drain extensions 134. The p-type dopants 190 may include atomic boron, BF$_2$, gallium and possibly indium. N-type dopants may be implanted at tilt angles of 15 degrees to 35 degrees to form halo regions under the gate 132. Other elements such as carbon may be co-implanted to provide desired dopant distributions in the p-type drain extensions 134. The p-type drain extension mask 188 is subsequently removed, for example similarly to the p-type well mask 178 of FIG. 2A. The substrate 102 may optionally be annealed at this point to activate the implanted p-type dopants 190, or the substrate 102 may be annealed after subsequent implants.

Figure 2D:
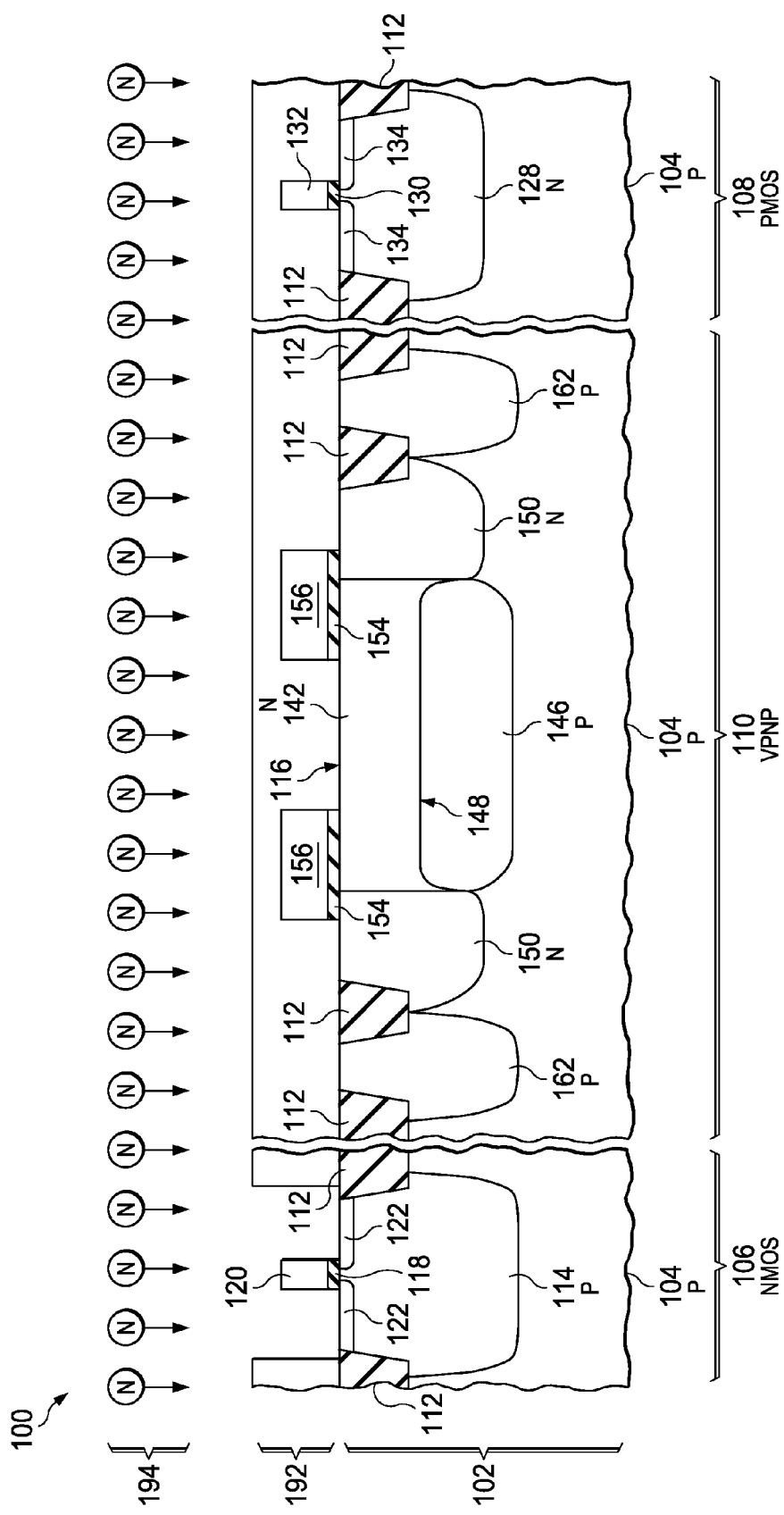

Referring to FIG. 2D, an n-type drain extension mask 192 is formed over the substrate 102 so that the NMOS transistor 106 is exposed, and the PMOS transistor 108 is covered. In the instant example, the vertical PNP bipolar transistor 110 is also covered by the n-type drain extension mask 192. In an alternate version of the instant example, the n-type drain extension mask 192 may expose a portion or all of the vertical PNP bipolar transistor 110. The n-type drain extension mask 192 may be formed similarly to the p-type drain extension mask 188 of FIG. 2C. N-type dopants 194 are implanted into the substrate 102 where exposed by the n-type drain extension mask 192, including into the substrate 102 adjacent to the gate 120 of the NMOS transistor 106 to form the n-type drain extensions 122. The n-type dopants 194 may include phosphorus, arsenic and possibly antimony. P-type dopants may be implanted at tilt angles of 15 degrees to 35 degrees to form halo regions under the gate 120. Other elements such as carbon may be co-implanted to provide desired dopant distributions in the n-type drain extensions 122. The n-type drain extension mask 192 is subsequently removed, for example similarly to the p-type well mask 178 of FIG. 2A. The substrate 102 may be annealed at this point to activate the implanted n-type dopants 194. In an alternative fabrication sequence, the n-type dopants 194 may be implanted prior to the p-type dopants 190 of FIG. 2C.

Figure 2E:
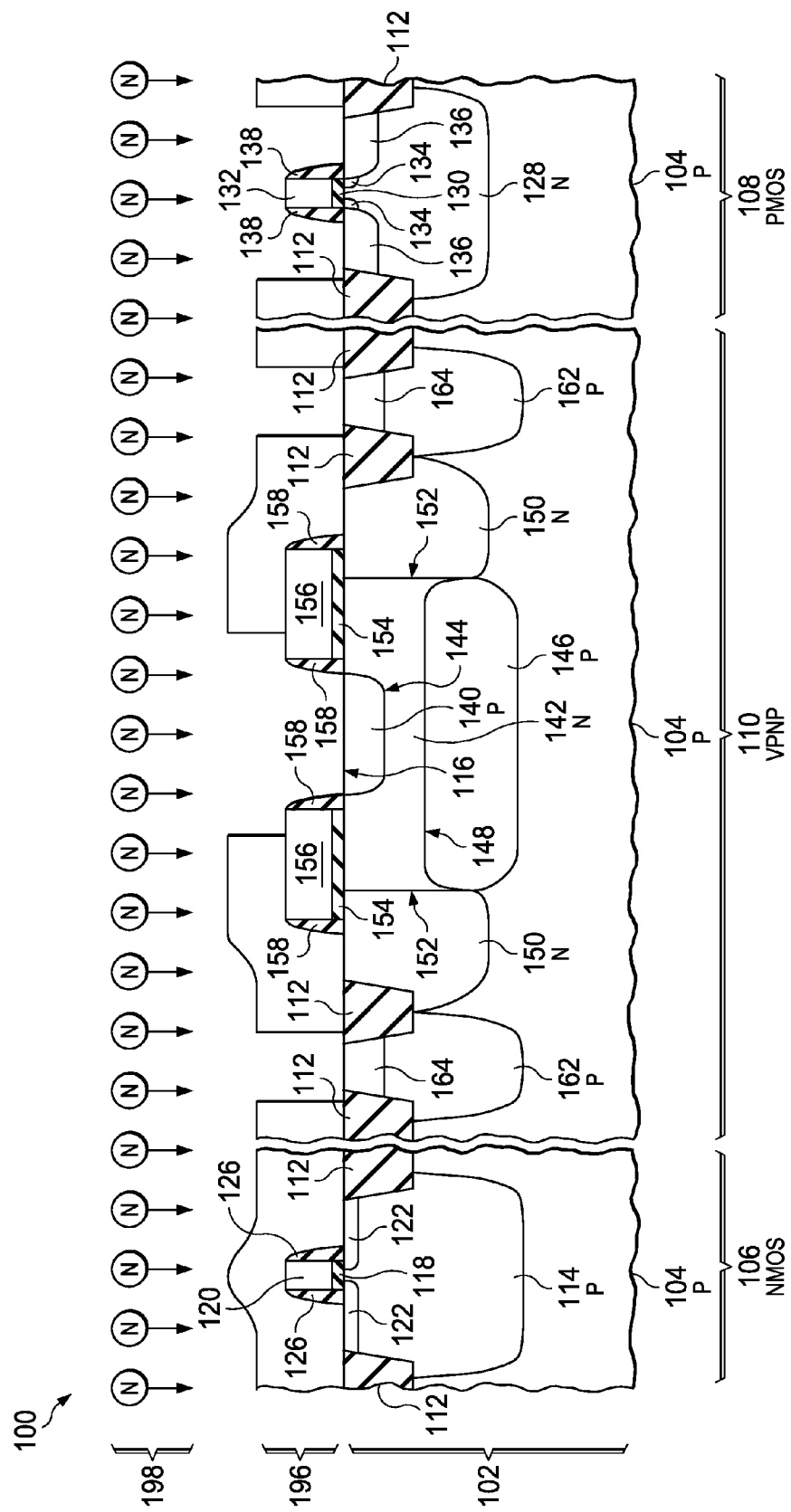

Referring to FIG. 2E, the gate sidewall spacers 126, 138 and 158 are formed adjacent to lateral surfaces of the gates 120, 132 and 156 of the NMOS transistor 106, the PMOS transistor 108 and the vertical PNP bipolar transistor 110, respectively. The gate sidewall spacers 126, 138 and 158 may be formed by forming one or more conformal layers of silicon nitride and/or silicon dioxide, followed by an anisotropic etch which removes the conformal dielectric layers from horizontal surfaces on the substrate, leaving the gate sidewall spacers 126, 138 and 158.

A p-type source/drain (PSD) mask 196 is formed over the substrate 102 so that the PMOS transistor 108 and the second p-type well 162 and an area for the emitter 140 are exposed. The NMOS transistor 106 and the extrinsic base 150 are covered by the PSD mask 196. The PSD mask 196 may include primarily photoresist and may be formed by a photolithographic process. P-type dopants 198 are implanted into the substrate 102 where exposed by the PSD mask 196, including into the substrate 102 adjacent to the gate 132 of the PMOS transistor 108 to form the p-type deep source/drain regions 136, into the substrate 102 surrounded by the gate 156 of the vertical PNP bipolar transistor 110 to form the emitter 140, and into the second p-type well 162 to form the collector contact regions 164. The p-type dopants 198 may include atomic boron, BF$_2$, gallium and possibly indium, at a total dose of $1 \times 10^{15}$ cm$^{-2}$ to $5 \times 10^{16}$ cm$^2$. Other elements such as carbon may be co-implanted to provide desired dopant distributions in the p-type deep source/drain regions 136 and the emitter 140. The PSD mask 196 is subsequently removed, for example similarly to the p-type well mask 178 of FIG. 2A. Forming the p-type deep source/drain regions 136 the emitter 140 and the collector contact regions 164 concurrently may advantageously reduce fabrication cost and complexity of the integrated circuit 100. The substrate 102 may optionally be annealed at this point to activate the implanted p-type dopants 198, or the substrate 102 may be annealed after subsequent implants.

Figure 2F:
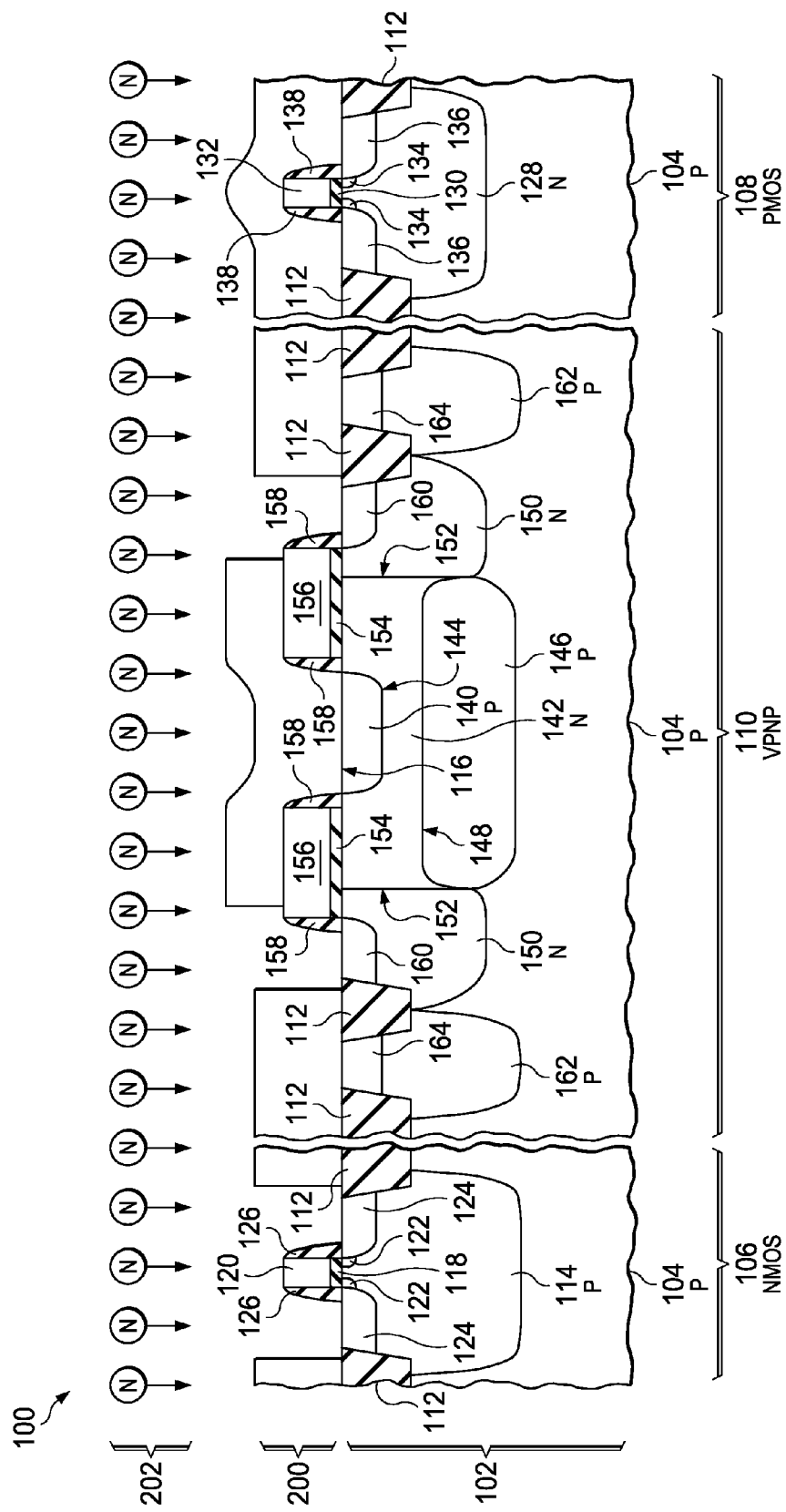

Referring to FIG. 2F, an n-type source/drain (NSD) mask 200 is formed over the substrate 102 so that the NMOS transistor 106 and the extrinsic base 150 are exposed. The PMOS transistor 108, the emitter 140 and the second p-type well 162 are covered by the NSD mask 200. The NSD mask 200 may be formed similarly to the PSD mask 196 of FIG. 2E. N-type dopants 202 are implanted into the substrate 102 where exposed by the NSD mask 200, including into the substrate 102 adjacent to the gate 120 of the NMOS transistor 106 to form the n-type deep source/drain regions 124, and into the extrinsic base 150 to form the base contact regions 160. The n-type dopants 202 may include phosphorus, arsenic and possibly antimony, at a total dose of $1 \times 10^{15}$ cm$^{-2}$ to $5 \times 10^{16}$ cm$^{-2}$. Other elements such as carbon may be co-implanted to provide desired dopant distributions in the n-type deep source/drain regions 124 and the base contact regions 160. The NSD mask 200 is subsequently removed, for example similarly to the p-type well mask 178 of FIG. 2A. Forming the n-type deep source/drain regions 124 and the base contact regions 160 concurrently may advantageously reduce fabrication cost and complexity of the integrated circuit 100. The substrate 102 may optionally be annealed at this point to activate the implanted n-type dopants 202. In an alternative fabrication sequence, the n-type dopants 202 may be implanted prior to the p-type dopants 198 of FIG. 2E.

Figure 2G:
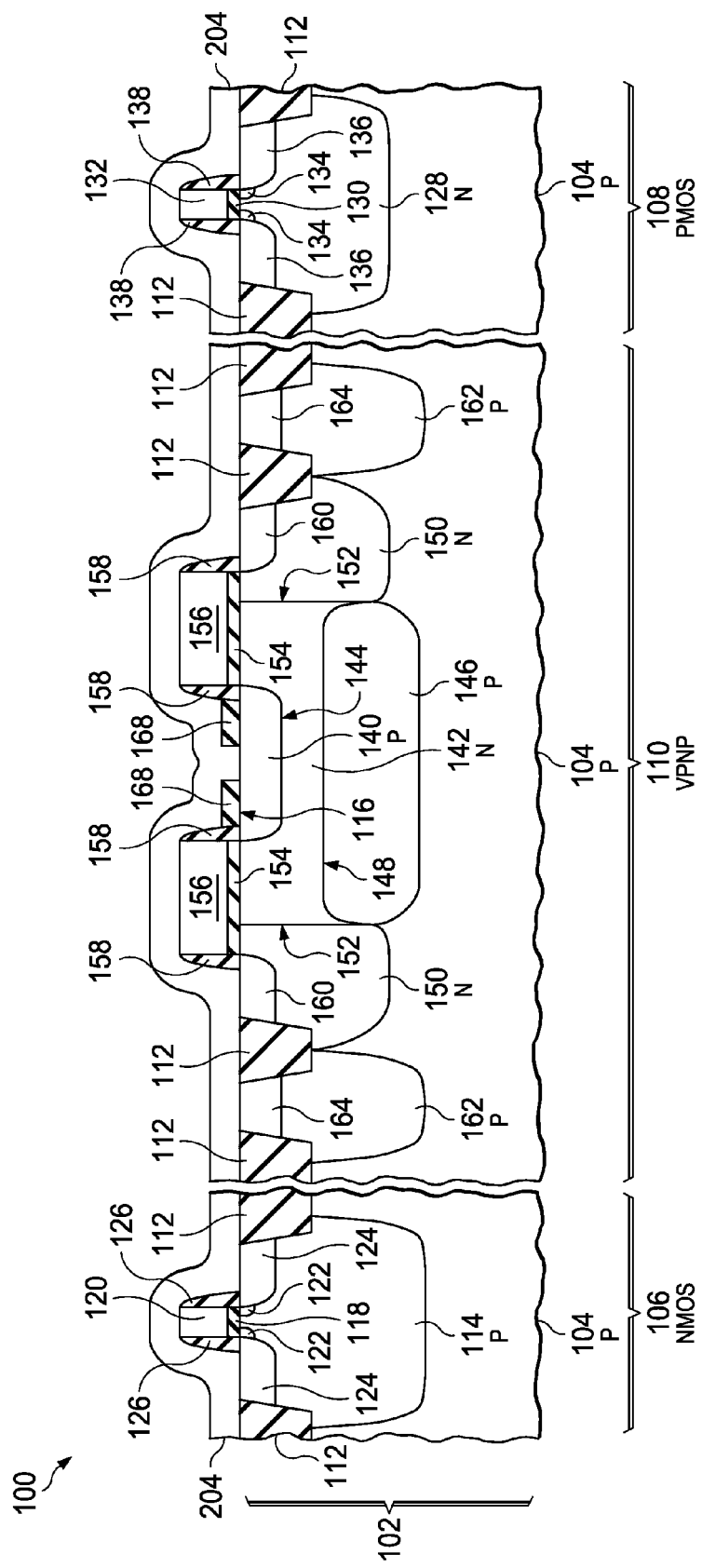

Referring to FIG. 2G, the silicide block dielectric 168 may be formed over portions of the emitter 140. The silicide block dielectric 168 may be formed by forming one or more layers of silicon dioxide and/or silicon nitride over a residual layer of gate dielectric on the top surface 116 of the substrate 102 in the emitter 140. An etch mask is formed over the layers of silicon dioxide and/or silicon nitride, and an etch process removes the layers of silicon dioxide and/or silicon nitride exposed by the etch mask. The etch mask is subsequently removed, for example by an ash process followed by a wet clean process, leaving the silicide block dielectric 168 in place over portions of the emitter 140.

A layer of metal 204 for the metal silicide 166 of FIG. 1 is formed over the substrate 102, the gates 120, 132 and 156, and the silicide block dielectric 168. The layer of metal 204 may include, for example, titanium, cobalt, nickel, platinum, or other metal suitable for forming self-aligned metal silicide. The layer of metal 204 may include a cap layer, for example a cap layer of titanium nitride. The layer of metal 204 contacts exposed silicon at the top surface 116 of the substrate 102 and possibly on top surfaces of the gates 120, 132 and 156.

Figure 2H:
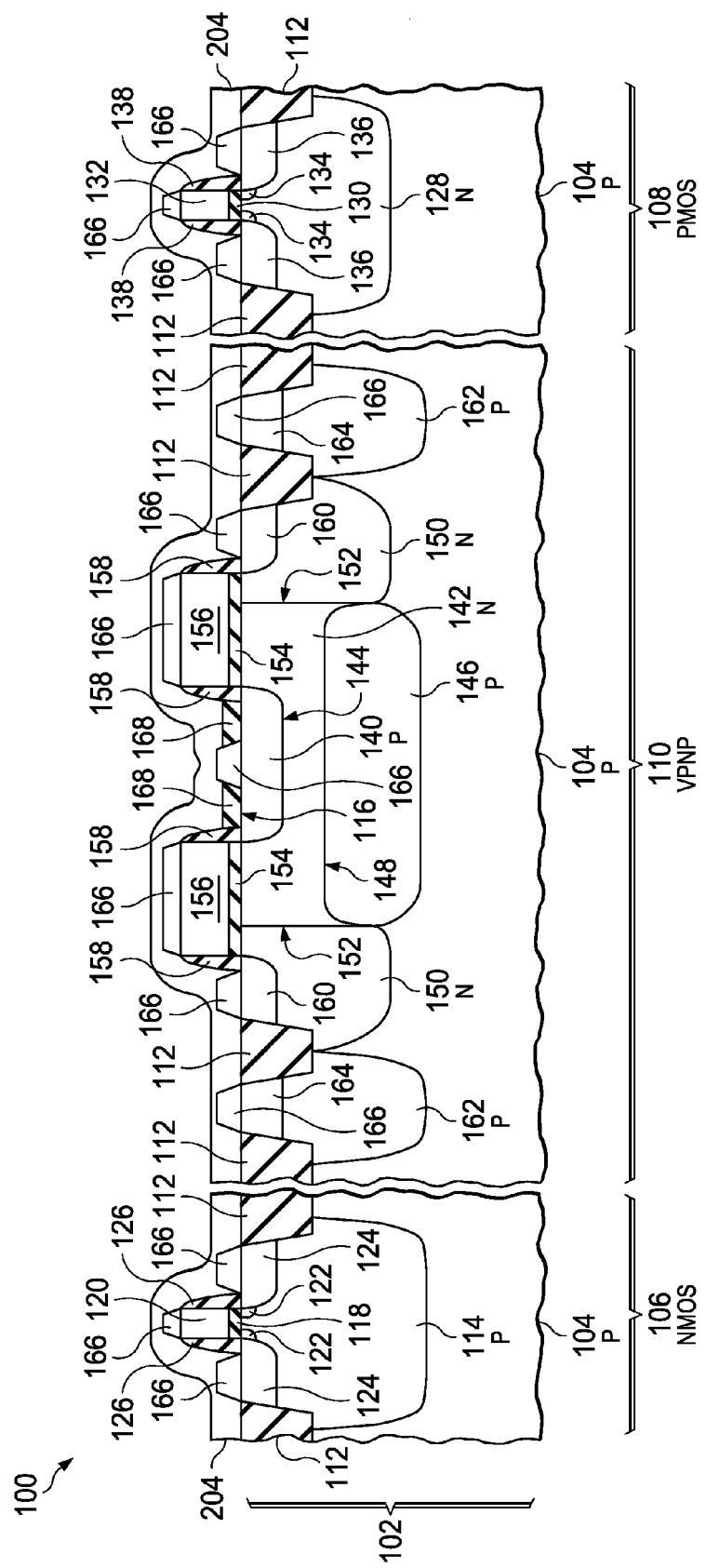

Referring to FIG. 2H, the layer of metal 204 is heated, causing the metal to react with the exposed silicon to form the metal silicide 166. The temperature and time required to form the metal silicide depends on the particular metal in the layer of metal 204. For example, forming titanium silicide generally requires a temperature above 650° C. Forming cobalt silicide generally requires a temperature of 350° C. to 650° C. Forming nickel silicide generally requires a lower temperature than titanium silicide. The particular temperature for forming nickel silicide may be affected by adding platinum to the layer of metal 204.

Figure 2I:
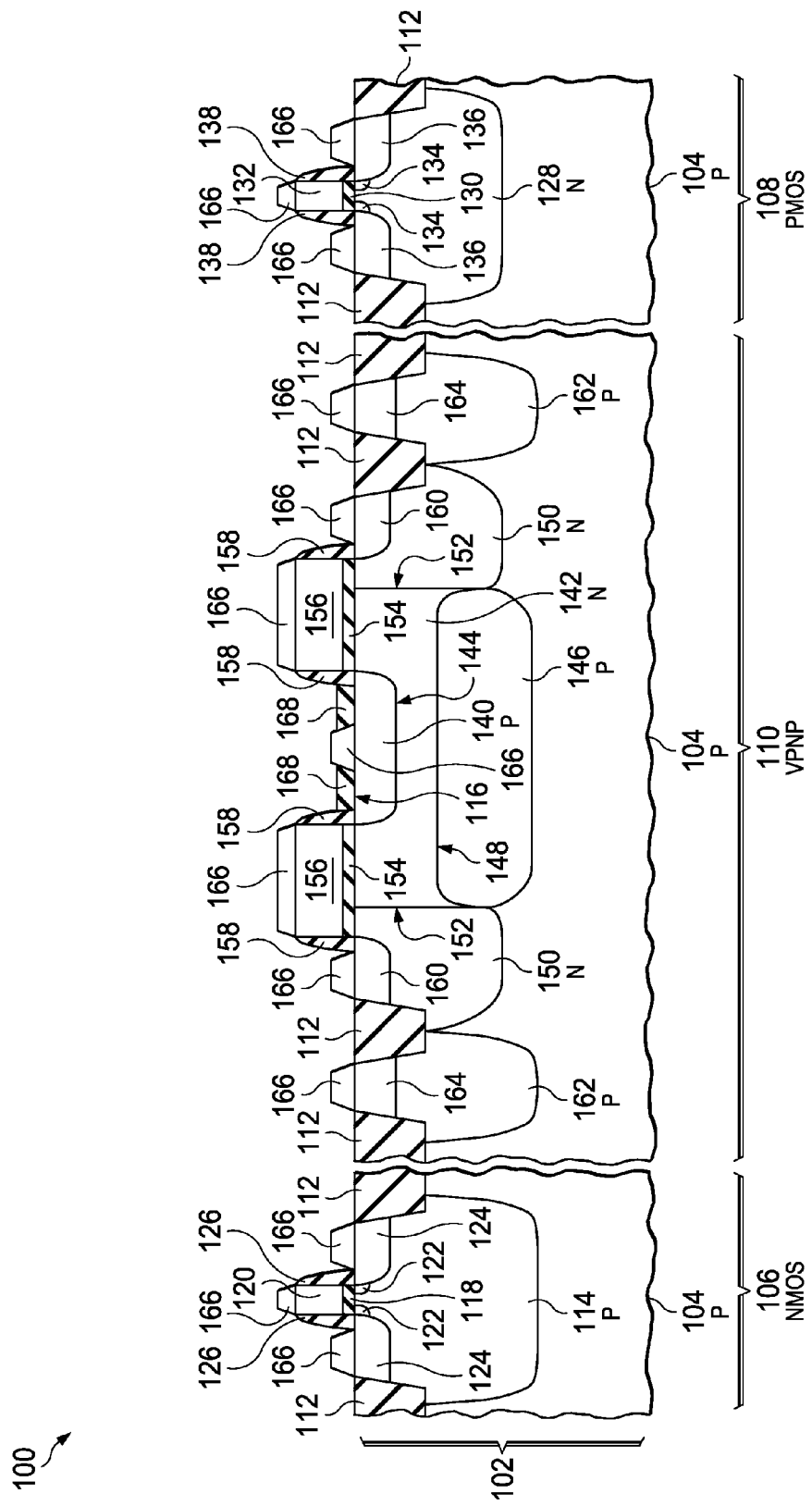

Referring to FIG. 2I, unreacted metal in the layer of metal 204 of FIG. 2H, including the cap layer if present, is subsequently removed, leaving the metal silicide 166 in place on the n-type deep source/drain regions 124 and the gate 120 of the NMOS transistor 106, on the p-type deep source/drain regions 136 and the gate 132 of the PMOS transistor 108, on the collector contact regions 164, the base contact regions 160, the emitter 140 and the gate 156 of the vertical PNP bipolar transistor 110. The unreacted metal may be removed by a wet etch process using an aqueous solution of sulfuric acid and hydrogen peroxide, or an aqueous solution of ammonium hydroxide and hydrogen peroxide. In another version of the instant example, the silicide block dielectric 168 may be omitted, and the metal silicide 166 may be formed on the emitter 140, extending to the gate sidewall spacers 158. Formation of the integrated circuit 100 continues with forming the PMD layer 170 of FIG. 1.

Figure 3A:
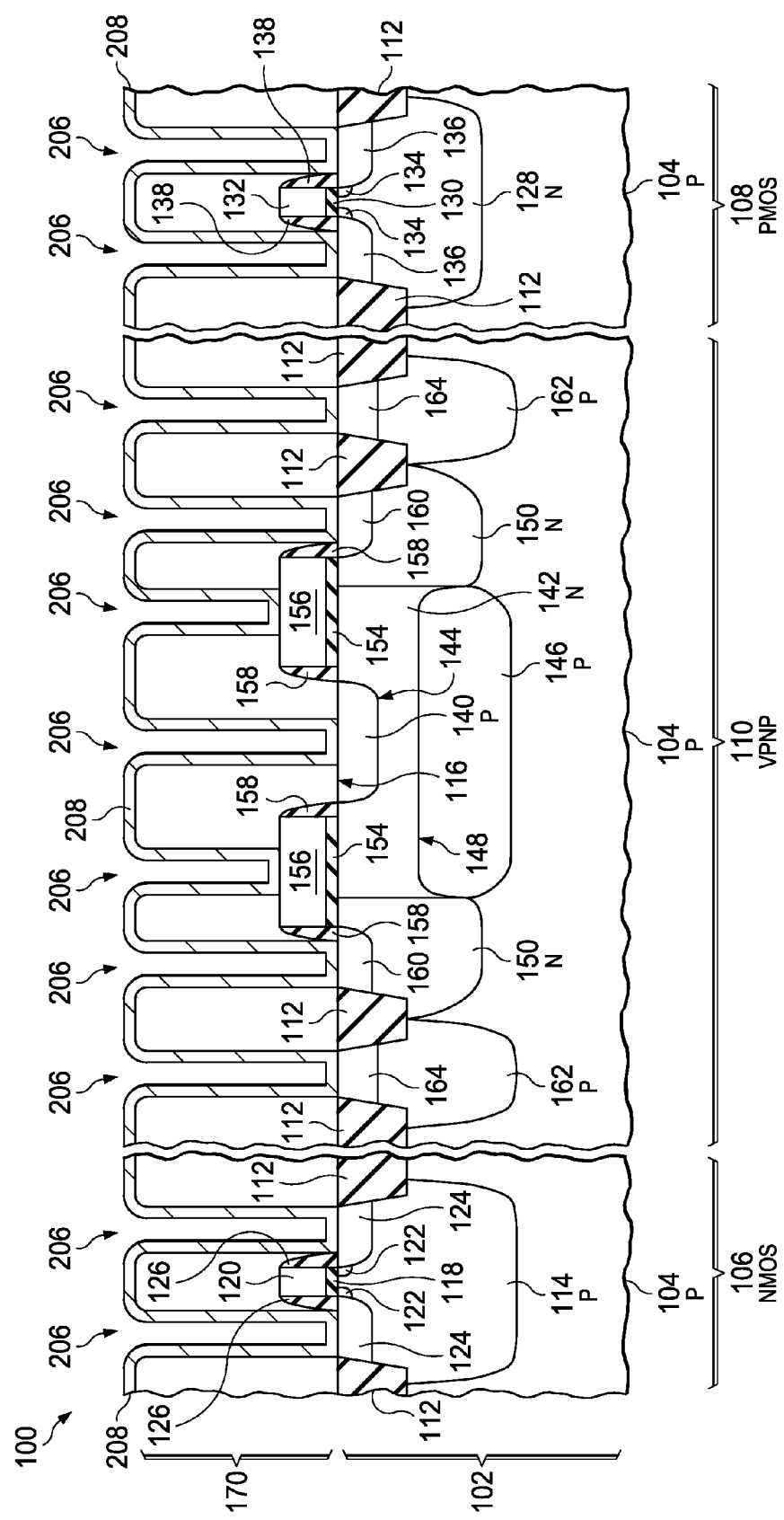
FIG. 3A through FIG. 3C are cross sections of another version of the integrated circuit of FIG. 1, depicted in successive stages for an alternate method of forming metal silicide.
Figure 3B:
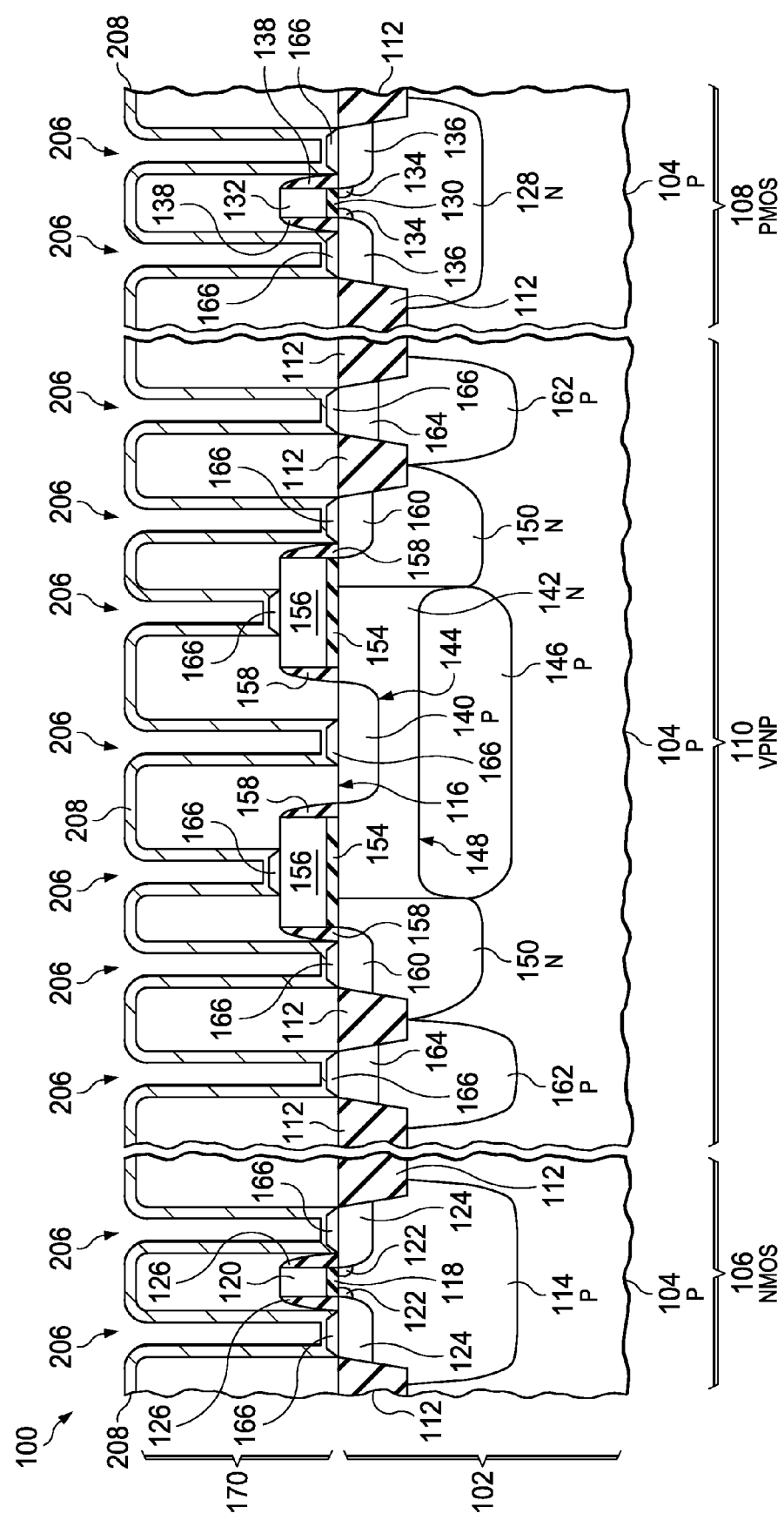
Figure 3C:
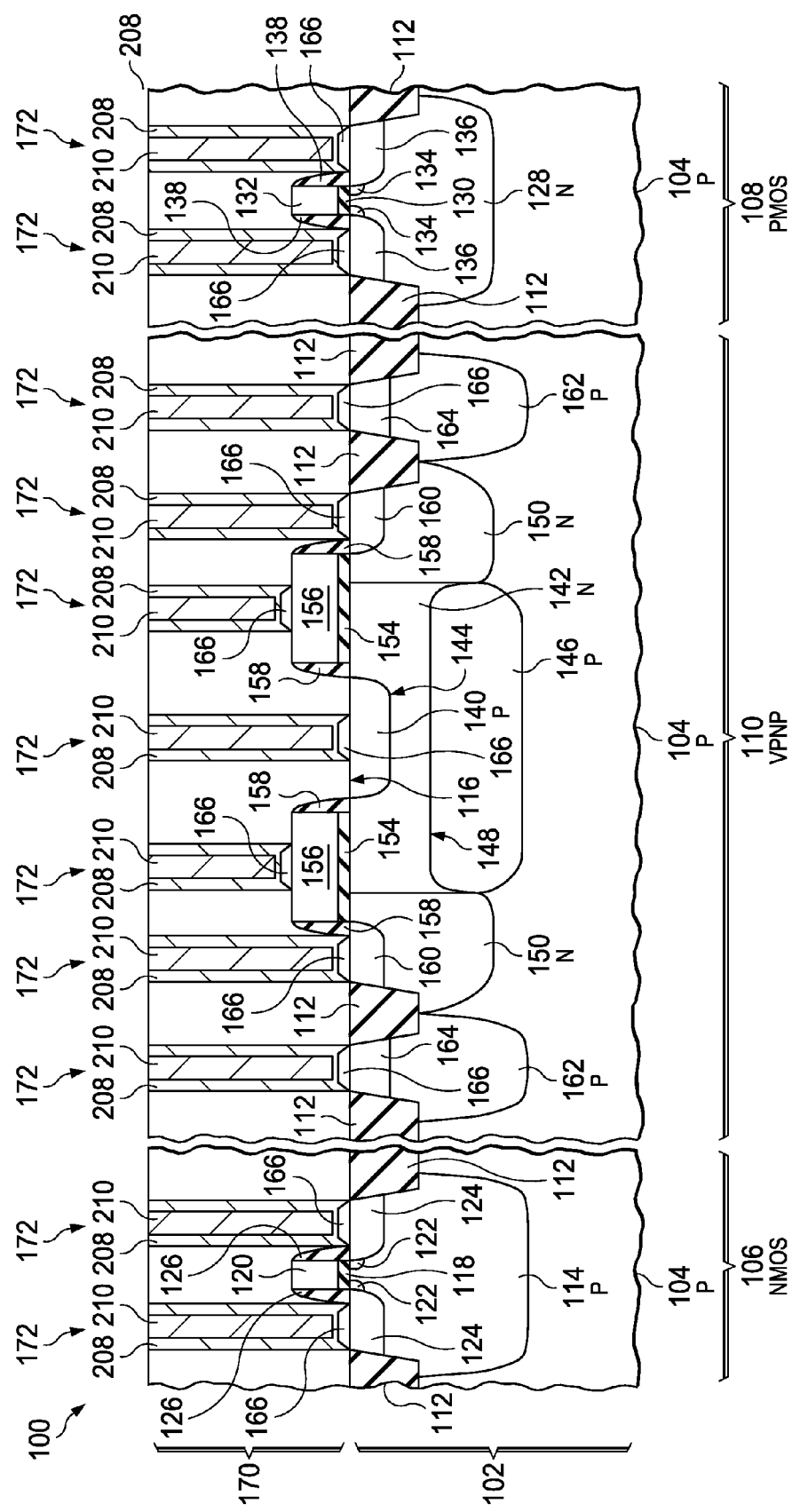

FIG. 3A through FIG. 3C are cross sections of another version of the integrated circuit of FIG. 1, depicted in successive stages for an alternate method of forming metal silicide. Referring to FIG. 3A, the NMOS transistor 106, the PMOS transistor 108 and the vertical PNP bipolar transistor 110 are formed in the substrate 102, for example as described in reference to FIG. 2A through FIG. 2F. In the instant example, silicide block dielectric is not formed. The PMD layer 170 is formed over the substrate 102. Contact holes 206 are formed through the PMD layer 170, exposing the n-type deep source/drain regions 124 of the NMOS transistor 106, the p-type deep source/drain regions 136 of the PMOS transistor 108, and the emitter 140, the base contact regions 160, the gate 156 and the collector contact regions 164 of the vertical PNP bipolar transistor 110. The contact holes 206 may be formed with a reactive ion etch (RIE) process. A contact liner 208 is formed over the PMD layer 170, extending into the contact holes 206 and contacting the substrate 102 and gate 156 where exposed by the contact holes 206. The contact liner 208 includes a metal such as titanium which is suitable for forming metal silicide and also provides desired adhesion to the PMD layer 170. The contact liner 208 may be formed by a sputter process or an ionized metal plasma (IMP) process. In the instant example, the contact liner 208 does not fill the contact holes 206.

Referring to FIG. 3B, the contact liner 208 is heated causing the metal in the contact liner 208 to react with exposed silicon in the substrate 102 and gate 156 to form metal silicide 166 at bottoms of the contact holes 206. Factors affecting the temperature and time for forming the metal silicide 166 are described in reference to FIG. 2H. An ambient during the heating of the contact liner 208 may include nitrogen which reacts with the contact liner to form a metal nitride layer. The metal nitride layer may help prevent a subsequently-formed contact fill metal from diffusing into the PMD layer 170. Limiting a lateral extent of the metal silicide 166 to the bottom of the contact hole 206 over the emitter 140 may provide the advantage with respect to silicide block dielectric, described in reference to FIG. 1, without the cost of forming the silicide block dielectric 168 of FIG. 1, thus advantageously reducing fabrication cost and complexity of the integrated circuit 100.

Referring to FIG. 3C, contact fill metal 210 is formed on the contact liner 208, and excess metal of the contact liner 208 and the contact fill metal 210 is removed from over the PMD layer 170, leaving the contact liner 208 and the contact fill metal 210 to form the contacts 172. The contact fill metal 210 may include tungsten, formed by a metal organic chemical vapor deposition (MOCVD) process. The excess metal of the contact liner 208 and the contact fill metal 210 may be removed from over the PMD layer 170 by a CMP process and/or a plasma etchback process.

Figure 4A:
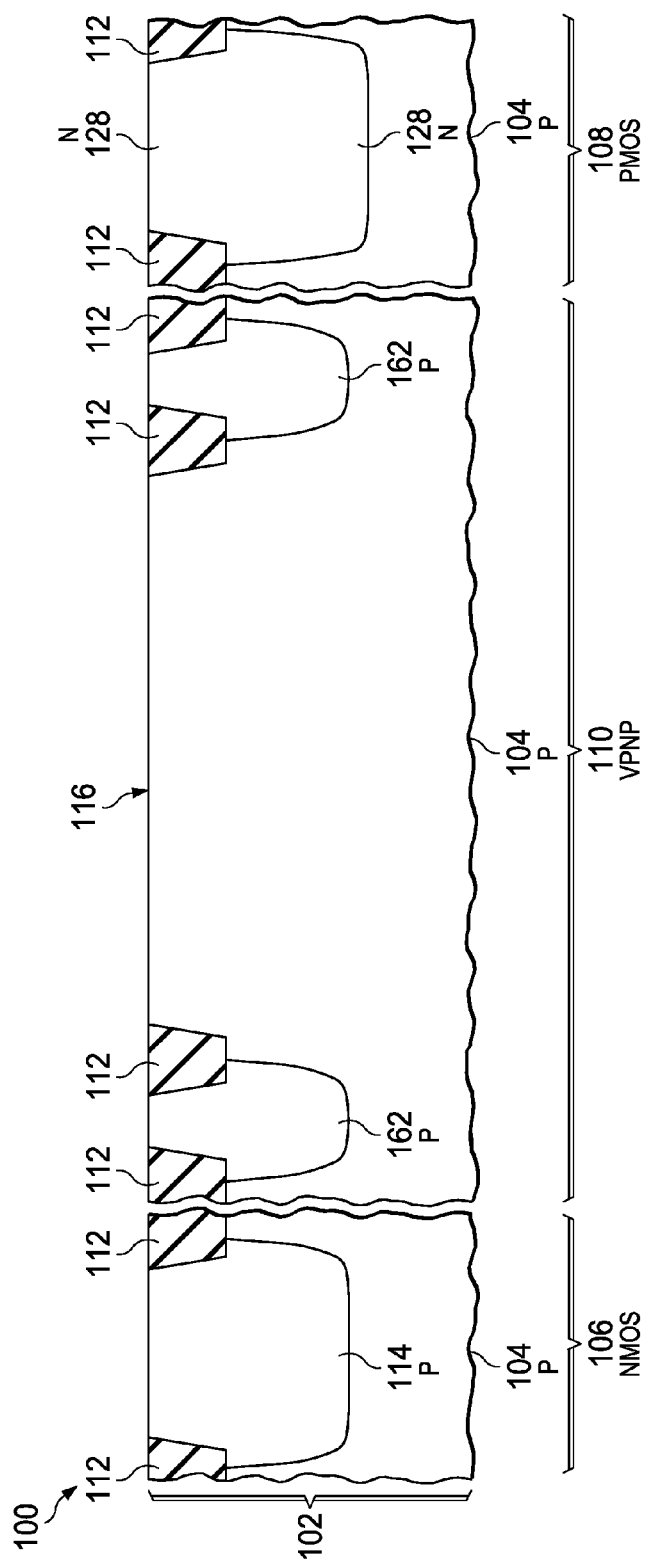
FIG. 4A through FIG. 4C are cross sections of another version of the integrated circuit of FIG. 1, depicted in successive stages for an alternate method of forming the intrinsic base.
Figure 4B:
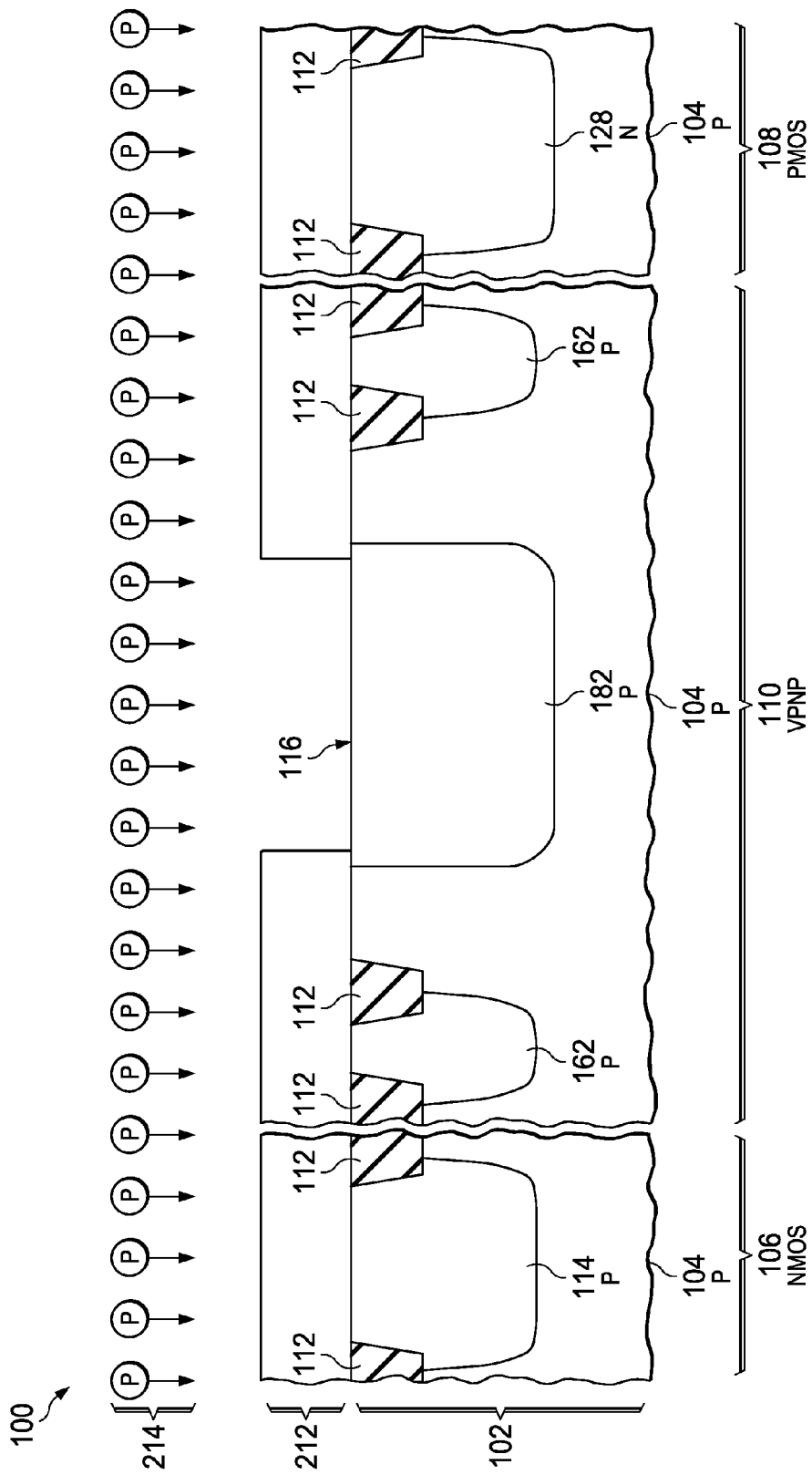
Figure 4C:
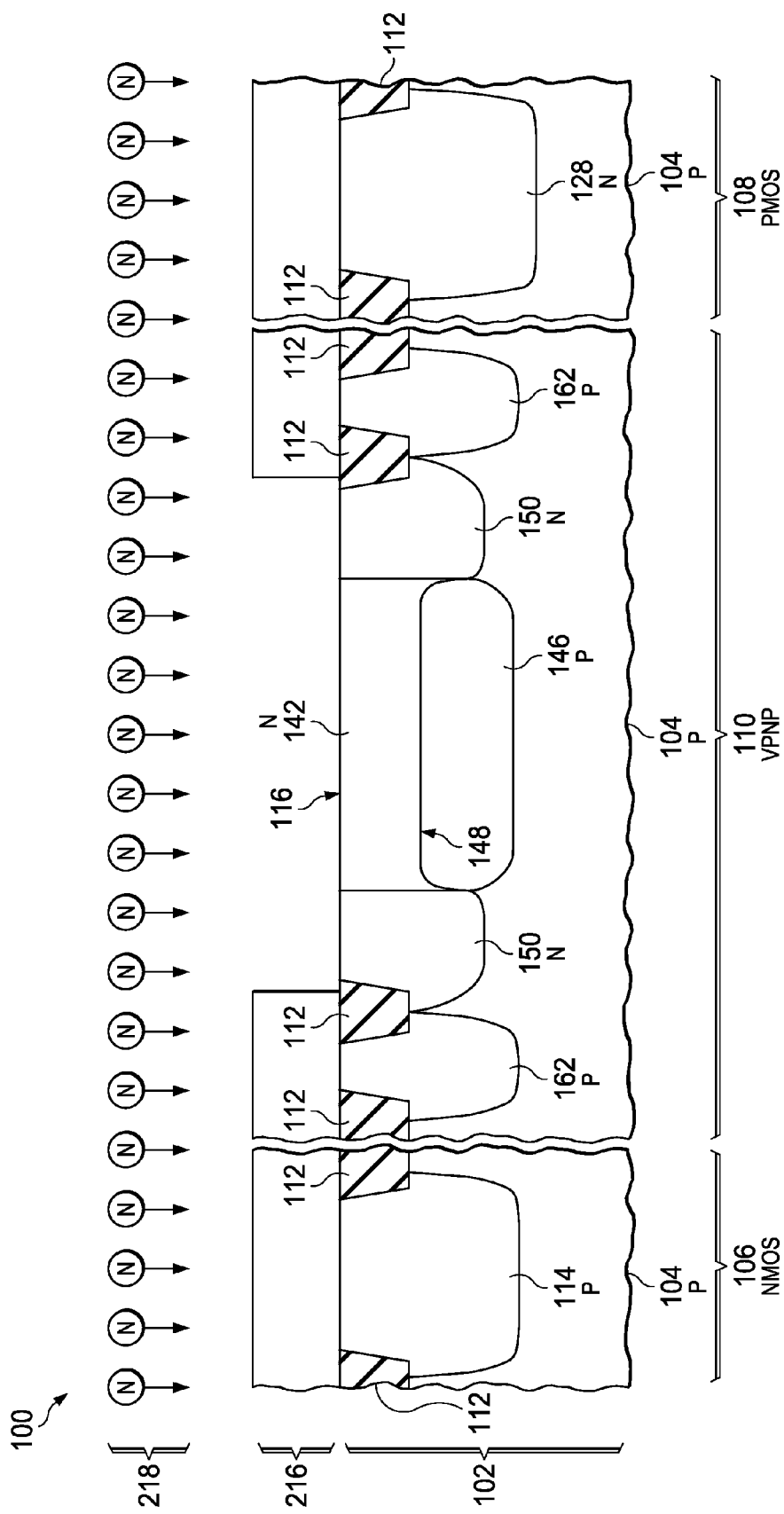

FIG. 4A through FIG. 4C are cross sections of another version of the integrated circuit of FIG. 1, depicted in successive stages for an alternate method of forming the intrinsic base. Referring to FIG. 4A, the field oxide 112 is formed at the top surface 116 of the substrate, by an STI process or a LOCOS process. The first p-type well 114 and the second p-type well 162 are formed in the substrate 102 without forming a collector of the vertical PNP bipolar transistor 110. The first n-type well 128 is formed in the substrate 102 without forming an intrinsic base or an extrinsic base of the vertical PNP bipolar transistor 110. In the instant example, the first n-type well 128 may be deeper than the first p-type well 114 and the second p-type well 162, which may advantageously enable forming an isolated p-type well for an extended drain PMOS transistor in the integrated circuit 100. Implant doses and energies used to form the first p-type well 114, the second p-type well 162 and the first n-type well 128 may be selected to provide dopant distributions which desirably enhance performance of the NMOS transistor 106 and the PMOS transistor 108 without being constrained by considerations of forming the collector, intrinsic base and extrinsic base of the vertical PNP bipolar transistor 110.

Referring to FIG. 4B, a collector mask 212 is formed over the substrate 102 exposing an area for the collector 146 of FIG. 1. The collector mask 212 covers areas for the NMOS transistor 106, the PMOS transistor 108, the second p-type well 162 and the extrinsic base 150 of FIG. 1. The collector mask 212 may be formed similarly to the p-type well mask 178 of FIG. 2A. P-type dopants 214 are implanted into the substrate 102 in the areas exposed by the collector mask 212 to form a collector well 182 in the area for the collector 146. The p-type dopants 214 may include primarily atomic boron, and may be implanted in several doses at different energies to provide a desired distribution of dopants for the collector and to more uniformly compensate the intrinsic base. The p-type dopants 214 may be implanted at a total dose of $3 \times 10^{13}$ cm$^{-2}$ to $8 \times 10^{13}$ cm$^{-2}$, with a peak energy of 250 kilo-electron volts (keV) to 400 keV. The collector mask 212 is subsequently removed, for example as described in reference to the p-type well mask 178 of FIG. 2A.

Referring to FIG. 4C, a base mask 216 is formed over the substrate 102 exposing an area for the extrinsic base 150 and the intrinsic base 142 of FIG. 1. The base mask 216 covers the areas for the NMOS transistor 106, the PMOS transistor 108 and the second p-type well 162. The base mask 216 may be formed similarly to the collector mask 212 of FIG. 4B. N-type dopants 218 are implanted into the substrate 102 in the area exposed by the base mask 216 to form the intrinsic base 142 and the extrinsic base 150 around the intrinsic base 142. The n-type dopants 218 may include primarily phosphorus, with some arsenic, and may be implanted in several doses at different energies to provide a desired distribution of dopants in the intrinsic base 142. The n-type dopants 218 may be implanted at a total dose of $2 \times 10^{13}$ cm$^{-2}$ to $7 \times 10^{13}$ cm$^{-2}$, with a peak energy of 400 kilo-electron volts (keV) to 600 keV. The intrinsic base 142 is formed by counterdoping the collector well 182 of FIG. 4B down to the base-collector junction 148. The collector 146 is consequently formed by the remaining collector well 182 below the base-collector junction 148, which is partially compensated by a tail of the implanted n-type dopants 218. The doses and energies of the n-type dopants 218 and the p-type dopants 214 of FIG. 4B are selected to provide desired dopant densities and dopant distributions for the intrinsic well 142 and the collector 146, and to provide a desired ratio of the net average dopant density of the extrinsic base 150 to the net average dopant density of the intrinsic base 142, as explained in reference to FIG. 1. In the instant example, the doses and energies of the n-type dopants 218 and the p-type dopants 214 may be selected to optimize performance of the vertical PNP bipolar transistor 110 without being constrained by considerations of the NMOS transistor 106 and the PMOS transistor 108. The base mask 216 is subsequently removed, for example similarly to the p-type well mask 178 of FIG. 2A. In an alternative fabrication sequence, the n-type dopants 218 may be implanted prior to the p-type dopants 214.

Figure 5:
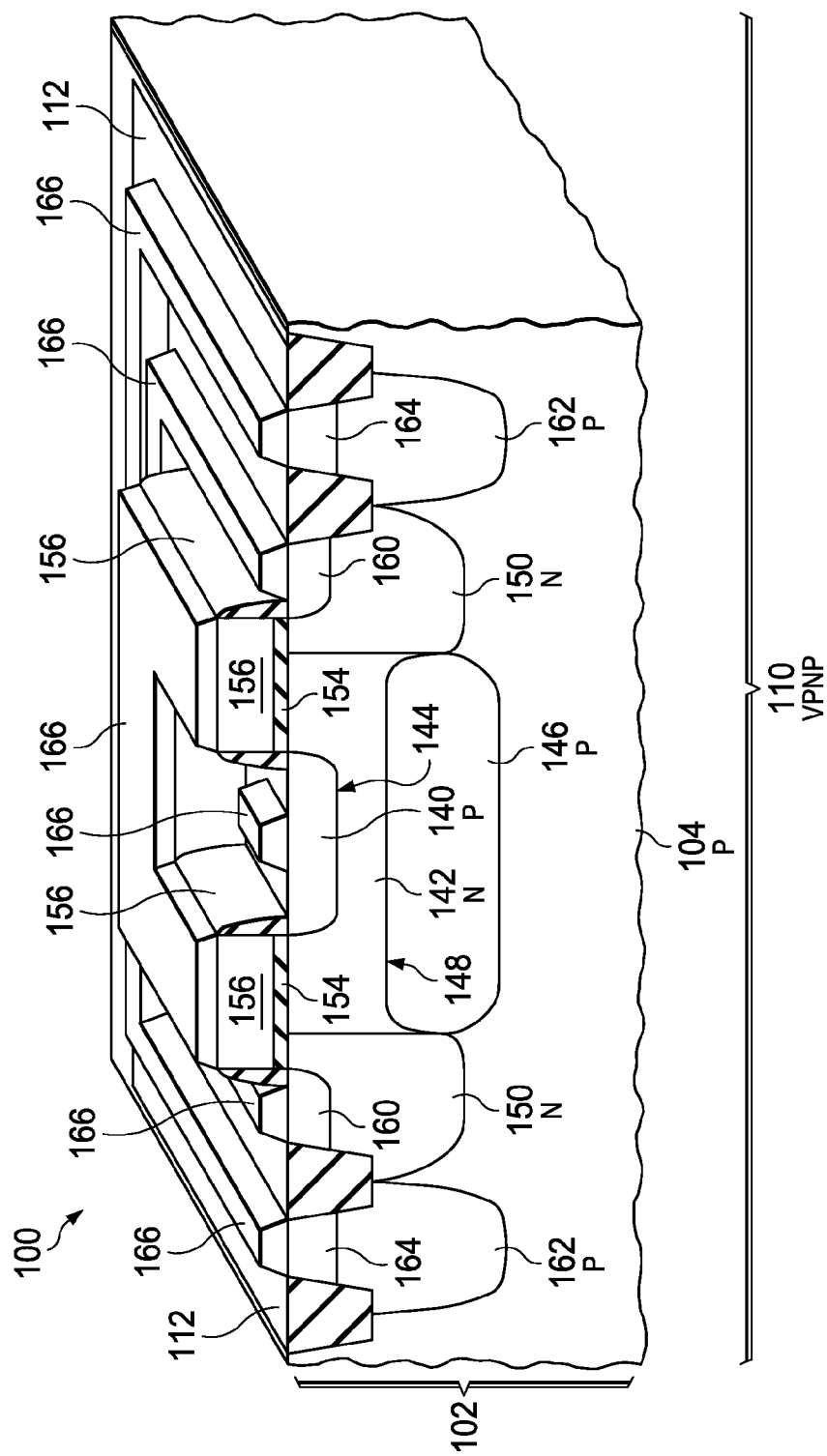
FIG. 5 is a cross section of a version of the integrated circuit of FIG. 1, depicting a concentric layout of the vertical PNP bipolar transistor.

FIG. 5 is a cross section of a version of the integrated circuit of FIG. 1, depicting a concentric layout of the vertical PNP bipolar transistor. In the instant example, the intrinsic base 142 completely surrounds the emitter 140, and the gate 156 has a closed-loop configuration, also completely surrounding the emitter 140, advantageously reducing recombination of carriers in the intrinsic base 142 at the complete top surface of the intrinsic base 142 except for the emitter-base junction 144. The extrinsic base 150 completely surrounds the intrinsic base 142, advantageously reducing recombination of carriers in the intrinsic base 142 at all lateral surfaces of the intrinsic base 142. Metal silicide 166 is disposed on the emitter 140, and is confined to a central location on the emitter 140, and does not extend adjacent to the gate 156, advantageously further reducing unwanted recombination of base current.

The base contact regions 160 may optionally be a single base contact region 160 which contiguously surrounds the gate 156 as depicted in FIG. 5, which may advantageously provide more uniform base current in the intrinsic base 142. Alternatively, the base contact regions 160 may optionally be a plurality of separate base contact regions, spread around the gate 156. Alternatively, the base contact regions 160 may optionally be disposed on two opposite sides of the gate 156 which may advantageously reduce space in the integrated circuit 100.

The second p-type well 162 may optionally surround the extrinsic base 150 as depicted in FIG. 5, which may advantageously provide more uniform current through the collector 146. Alternatively, the second p-type well 162 may optionally be disposed on two opposite sides of the extrinsic base 150, which may advantageously save space in the integrated circuit 100. The collector contact regions 164 may have a similar configuration to any of the alternative configurations discussed in reference to the base contact regions 160, accruing similar advantages.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit, comprising the steps:
   providing a substrate comprising a silicon-based semiconductor material;
   implanting p-type dopants into the substrate to form a first p-type well in an area for an NMOS transistor;
   implanting n-type dopants into the substrate to form a first n-type well in an area for a PMOS transistor;
   implanting dopants of a first conductivity type into the substrate to form a collector well of the first conductivity type in an area for a vertical bipolar transistor;
   implanting dopants of a second, opposite, conductivity type into the substrate to form an extrinsic base of the second conductivity type of the vertical bipolar transistor, and to form an intrinsic base of the second conductivity type of the vertical bipolar transistor, the extrinsic base contacting and laterally surrounding the collector well, the intrinsic base being formed by the dopants of the second type counterdoping an upper portion of the collector well, the extrinsic base having a net average dopant density at least 3 times a net average dopant density of the intrinsic base, a remaining portion of the collector well which has the first conductivity type, below the intrinsic base, providing a collector of the vertical bipolar transistor;

forming a gate dielectric layer at a top surface of the substrate over the intrinsic base and extending onto the extrinsic base;

forming a gate on the gate dielectric layer, the gate surrounding an area for an emitter of the vertical bipolar transistor, the area for the emitter being laterally separated from the extrinsic base by the intrinsic base around the area for the emitter; and implanting dopants of the first conductivity type into the substrate in the area for the emitter to form the emitter, the emitter having the first conductivity type, the emitter being substantially aligned with the gate and being above a portion of the intrinsic base.

2. The process of claim 1, wherein:

the first conductivity type is p-type;

the second conductivity type is n-type;

implanting the p-type dopants to form the first p-type well, and implanting the dopants of the first conductivity type to form the collector well, are performed concurrently; and implanting the n-type dopants to form the first n-type well, and implanting the dopants of the second conductivity type to form the extrinsic base and the intrinsic base, are performed concurrently.

3. The process of claim 1, comprising forming contacts and metal interconnects over the substrate electrically coupling the emitter to the gate.

4. The process of claim 1, wherein:

the intrinsic base is 200 nanometers to 400 nanometers thick between the emitter- and the junction; and the average net dopant density in the intrinsic base is $1 \times 10^{17}$ cm$^{-3}$ to $5 \times 10^{17}$ cm$^{-3}$.

5. The process of claim 1, wherein the gate dielectric layer over the intrinsic base is formed concurrently with at least one of a gate dielectric layer of the NMOS transistor and a gate dielectric layer of the PMOS transistor.

6. The process of claim 1, comprising the steps:

forming a p-type drain extension mask over the substrate, the p-type drain extension mask exposing the PMOS transistor and covering the vertical bipolar transistor and the NMOS transistor;

implanting p-type dopants into the substrate where exposed by the p-type drain extension mask to form p-type drain extensions of the PMOS transistor;

subsequently removing the p-type drain extension mask;

forming an n-type drain extension mask over the substrate, the n-type drain extension mask exposing the NMOS transistor and covering the vertical bipolar transistor and the PMOS transistor;

implanting n-type dopants into the substrate where exposed by the n-type drain extension mask to form n-type drain extensions of the NMOS transistor; and subsequently removing the n-type drain extension mask.

7. The process of claim 1, comprising forming metal silicide at the top surface of the substrate in the emitter.

8. The process of claim 7, wherein the metal silicide is formed in such a way that there is a portion of the top surface in the emitter adjacent to the gate which is free of the metal silicide.

* * * * *